(12) United States Patent
Eguchi et al.

(10) Patent No.: US 12,080,692 B2
(45) Date of Patent: Sep. 3, 2024

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Keisuke Eguchi, Tokyo (JP); Hiroyuki Masumoto, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 250 days.

(21) Appl. No.: 17/578,799

(22) Filed: Jan. 19, 2022

(65) Prior Publication Data

US 2022/0336429 A1 Oct. 20, 2022

(30) Foreign Application Priority Data

Apr. 19, 2021 (JP) .................................. 2021-070300

(51) Int. Cl.
*H01L 25/16* (2023.01)
*H01L 21/48* (2006.01)
(Continued)

(52) U.S. Cl.
CPC .......... *H01L 25/16* (2013.01); *H01L 21/4807* (2013.01); *H01L 23/3735* (2013.01);
(Continued)

(58) Field of Classification Search
CPC ..... H01L 21/4867; H01L 24/48; H01L 24/30; H01L 23/3735; H01L 24/29; H01L 24/32;
(Continued)

(56) References Cited

U.S. PATENT DOCUMENTS

2007/0221704 A1 9/2007 Takakusaki et al.
2013/0056882 A1* 3/2013 Kim ..................... H01L 25/0657
257/E23.141
(Continued)

FOREIGN PATENT DOCUMENTS

CN 110167695 A 8/2019
CN 111816633 A 10/2020
(Continued)

OTHER PUBLICATIONS

An Office Action; "Notice of Reasons for Refusal," mailed by the Japanese Patent Office on Feb. 27, 2024, which corresponds to Japanese Patent Application No. 2021-070300 and is related to U.S. Appl. No. 17/578,799; with English language translation.
(Continued)

*Primary Examiner* — Mouloucoulaye Inoussa
(74) *Attorney, Agent, or Firm* — Studebaker & Brackett PC

(57) ABSTRACT

A semiconductor device includes: a metal sheet; an insulating pattern provided on the metal sheet; a power circuit pattern and a signal circuit pattern that are provided on the insulating pattern; a power semiconductor chip mounted on the power circuit pattern; and a control semiconductor chip that is mounted on the signal circuit pattern and controls the power semiconductor chip. The power semiconductor chip is bonded to the power circuit pattern with a first die bonding material comprised of copper, and the control semiconductor chip is bonded to the signal circuit pattern with a second die bonding material.

17 Claims, 9 Drawing Sheets

(51) Int. Cl.
*H01L 23/00* (2006.01)
*H01L 23/373* (2006.01)
(52) U.S. Cl.
CPC .............. *H01L 24/29* (2013.01); *H01L 24/30* (2013.01); *H01L 24/32* (2013.01); *H01L 24/48* (2013.01); *H01L 24/73* (2013.01); *H01L 2224/29147* (2013.01); *H01L 2224/3003* (2013.01); *H01L 2224/32225* (2013.01); *H01L 2224/48225* (2013.01); *H01L 2224/73265* (2013.01); *H01L 2924/1203* (2013.01); *H01L 2924/1205* (2013.01); *H01L 2924/13055* (2013.01); *H01L 2924/1426* (2013.01); *H01L 2924/15787* (2013.01); *H01L 2924/1579* (2013.01)

(58) Field of Classification Search
CPC ..... H01L 25/16; H01L 21/4807; H01L 24/27; H01L 25/50; H01L 24/73; H01L 24/83; H01L 24/11; H01L 23/5386; H01L 25/072; H01L 23/3677; H01L 25/115; H01L 23/3737; H01L 23/36; H01L 23/367; H01L 23/3732; H01L 25/18; H01L 23/42; H01L 23/3736; H01L 23/433; H01L 25/07; H01L 23/3107; H01L 23/49816; H01L 24/19; H01L 25/0657; H01L 21/486; H01L 24/96; H01L 21/4853; H01L 23/49827; H01L 24/16; H01L 21/568; H01L 24/82; H01L 23/5389; H01L 23/3128; H01L 23/5383; H01L 23/5226; H01L 23/562; H01L 25/105; H01L 24/17; H01L 23/481; H01L 24/20; H01L 24/09; H01L 24/33; H01L 25/0652; H01L 23/5283; H01L 23/16; H01L 2224/29294; H01L 2224/2732; H01L 2224/2747; H01L 2224/133; H01L 2224/13347; H01L 2224/13294; H01L 2224/3003; H01L 2924/1205; H01L 2224/293; H01L 2224/32225; H01L 2224/0603; H01L 2224/32227; H01L 2224/29347; H01L 2224/05554; H01L 2224/8184; H01L 2224/8384; H01L 2224/83862; H01L 2224/04042; H01L 2924/15787; H01L 2224/29147; H01L 2224/29191; H01L 2224/1147; H01L 2224/73265; H01L 2924/19041; H01L 2224/48225; H01L 2224/49175; H01L 2224/16227; H01L 2224/1132; H01L 2924/19105; H01L 2924/19107; H01L 2224/83192; H01L 2224/81862; H01L 2924/1203; H01L 2224/73251; H01L 2924/3511; H01L 2224/32245; H01L 2224/48247; H01L 2924/181; H01L 2924/00012; H01L 2224/48091; H01L 2924/00014; H01L 2224/13147; H01L 2224/33181; H01L 2224/81815; H01L 2225/06562; H01L 2924/18161; H01L 2224/14155; H01L 2224/2746; H01L 2224/97; H01L 2224/73253; H01L 2924/1438; H01L 2225/06517; H01L 2924/18162; H01L 2224/32145; H01L 2225/1035; H01L 2224/73217; H05K 1/0206; H05K 7/209; H05K 7/20436; H05K 7/20445; H05K 1/181
See application file for complete search history.

(56) References Cited

U.S. PATENT DOCUMENTS

| | | |
|---|---|---|
| 2013/0127048 A1* | 5/2013 | Hasegawa .......... H01L 25/0657 |
| | | 257/737 |
| 2013/0187261 A1 | 7/2013 | Iwamura et al. |
| 2015/0171066 A1* | 6/2015 | Yamamichi ............. H01L 25/18 |
| | | 257/411 |
| 2018/0250751 A1 | 9/2018 | Kawana et al. |
| 2019/0189537 A1* | 6/2019 | Fujino .................... H01L 23/48 |
| 2019/0355690 A1 | 11/2019 | Nakako et al. |
| 2020/0020638 A1* | 1/2020 | Heo ..................... H01L 23/5383 |
| 2020/0328178 A1 | 10/2020 | Masumoto |
| 2020/0343155 A1* | 10/2020 | Kiyonaga ............. H05K 1/0206 |
| 2021/0143121 A1 | 5/2021 | Nakako et al. |

FOREIGN PATENT DOCUMENTS

| | | |
|---|---|---|
| JP | 2006-237573 A | 9/2006 |
| JP | 2013-149779 A | 8/2013 |
| JP | 2021-048396 A | 3/2021 |

OTHER PUBLICATIONS

An Office Action mailed by the Chinese Patent Office on May 29, 2024, which corresponds to Chinese Patent Application No. 202210391309.2 and is related to U.S. Appl. No. 17/578,799.

* cited by examiner

F I G. 2
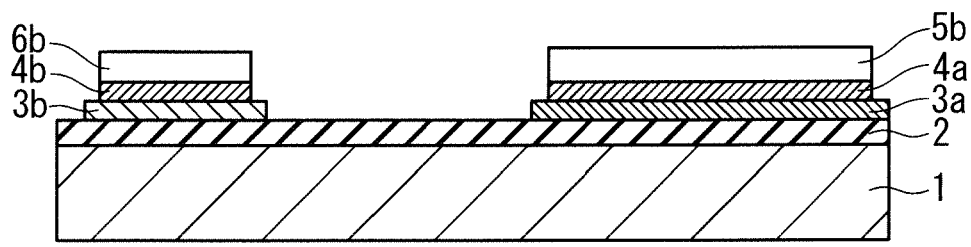

SEMICONDUCTOR DEVICE AND METHOD FOR MANUFACTURING SEMICONDUCTOR DEVICE

BACKGROUND OF THE INVENTION

Field of the Invention

The present disclosure relates to a semiconductor device and a method for manufacturing the semiconductor device.

Description of the Background Art

Conventionally, a semiconductor device in which a power semiconductor chip and a control semiconductor chip for controlling the power semiconductor chip are integrated into one module has been commercialized. Such a semiconductor device is required to be further miniaturized.

For example, Japanese Patent Application Laid-Open No. 2013-149779 discloses a semiconductor device in which a circuit pattern to which a power semiconductor chip and a control semiconductor chip are bonded is configured with a thin metal sheet such as a lead frame. By reducing the thickness of the circuit pattern, it is possible to achieve miniaturization of the semiconductor device.

However, in the semiconductor device described in Japanese Patent Application Laid-Open No. 2013-149779, since the circuit pattern is composed of a thin metal sheet such as a lead frame, the thermal conductivity of the circuit pattern is lowered. As a result, there is a problem that the heat dissipation for the power semiconductor chip is deteriorated.

SUMMARY

An object of the present disclosure is to provide a technique capable of ensuring heat dissipation for a power semiconductor chip and achieving miniaturization of a semiconductor device.

A semiconductor device according to the present disclosure includes: a metal sheet; an insulating pattern; a circuit pattern; a power semiconductor chip; and a control semiconductor chip. The insulating pattern is provided on the metal sheet. The circuit pattern is provided on the insulating pattern. The power semiconductor chip is mounted on the circuit pattern. The control semiconductor chip is mounted on the circuit pattern and controls the power semiconductor chip. The power semiconductor chip is bonded to the circuit pattern with a first die bonding material comprised of copper. The control semiconductor chip is bonded to the circuit pattern by a second die bonding material.

Since the first die bonding material comprised of copper is used to bond the power semiconductor chip to the circuit pattern, the heat dissipation for the power semiconductor chip is improved as compared with a conventional case where solder is used. As a result, heat dissipation for the power semiconductor chip can be ensured even when the circuit pattern is thinned. As a result, it is possible to secure heat dissipation for the power semiconductor chip and to achieve miniaturization of the semiconductor device.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 2 is a cross-sectional view taken along line A-A of FIG. 1;

DESCRIPTION OF THE PREFERRED EMBODIMENTS

First Preferred Embodiment

<Structure of Semiconductor Device>

Figure 1:
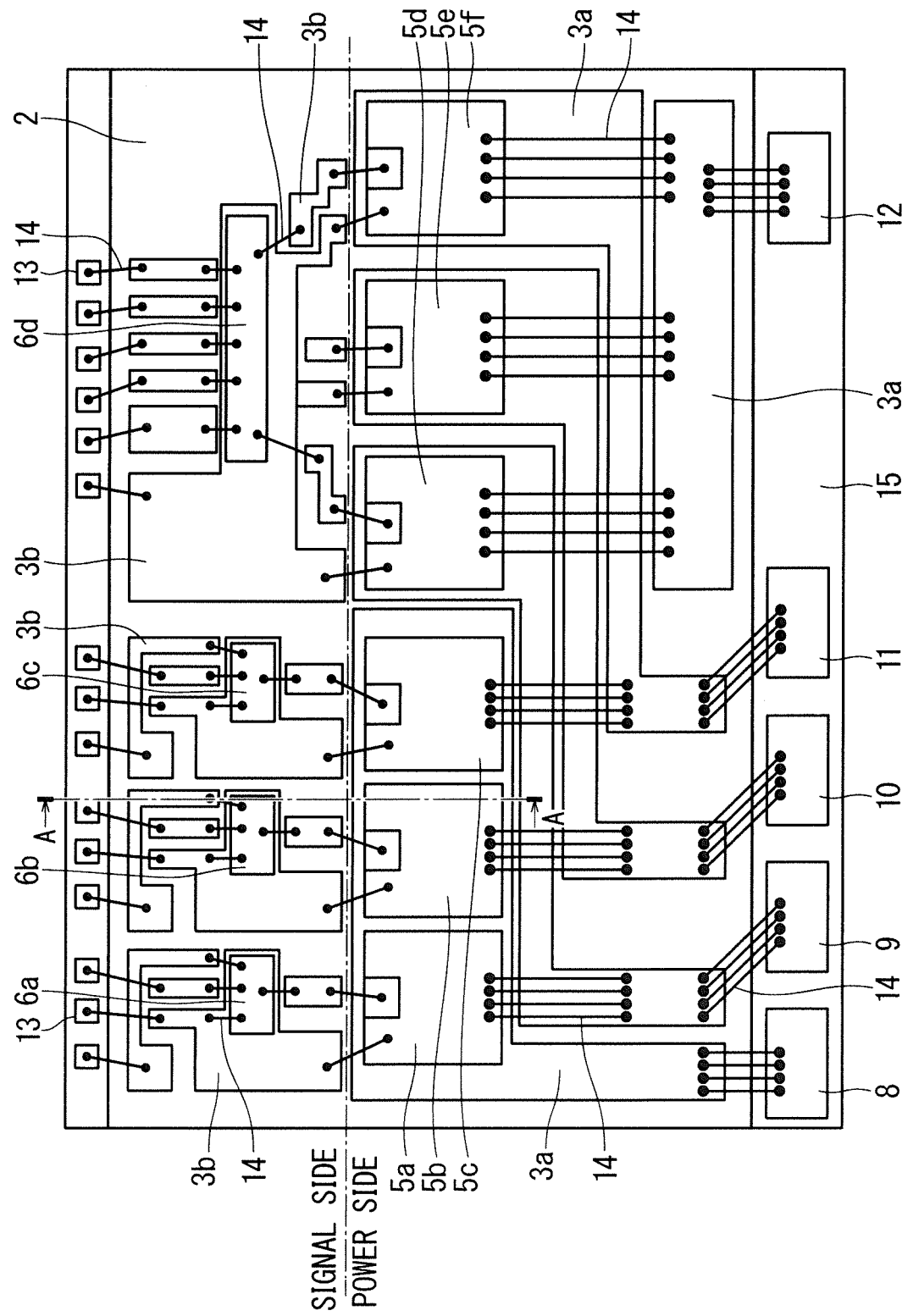
FIG. 1 is a top view illustrating a structure of a semiconductor device according to a first preferred embodiment.

A first preferred embodiment will be described below with reference to the drawings. FIG. 1 is a top view illustrating a structure of a semiconductor device according to the first preferred embodiment. FIG. 2 is a cross-sectional view taken along line A-A of FIG. 1

As illustrated in FIGS. 1 and 2, the semiconductor device includes: a metal sheet 1; an insulating pattern 2; a plurality of power circuit patterns 3a; a plurality of signal circuit patterns 3b; a plurality of (for example, six) power semiconductor chips 5a to 5f; a plurality of (for example, four) control semiconductor chips 6a to 6d; a P electrode 8; a U electrode 9; a V electrode 10; a W electrode 11; an N electrode 12; a plurality of signal terminals 13; a plurality of aluminum wires 14; and a casing 15.

The metal sheet 1 is a member for dissipating heat generated by the power semiconductor chips 5a to 5f. The insulating pattern 2 is comprised of ceramic, resin, or the like, and is provided on the entire upper surface of the metal sheet 1. The insulating pattern 2 may be a single component or may be divided into a plurality of pieces. The metal sheet 1 and the insulating pattern 2 may be bonded via solder.

The plurality of power circuit patterns 3a are provided on a power side (the lower part of FIG. 1) on the upper surface of the insulating pattern 2. The plurality of signal circuit patterns 3b are provided on a signal side (the upper part of FIG. 1) on the upper surface of the insulating pattern 2. The power circuit patterns 3a and the signal circuit patterns 3b correspond to a circuit pattern. When the power circuit patterns 3a and the signal circuit patterns 3b are not distinguished from each other, they are simply referred to as a circuit pattern.

The power semiconductor chips 5a to 5f are, for example, reverse conducting insulated gate bipolar transistors (RC-IGBTs) in each of which a switching unit and a reflux unit are integrated into one chip, and the power semiconductor chips 5a to 5f are mounted on the power circuit patterns 3a.

The power semiconductor chips 5a to 5f are bonded to the power circuit patterns 3a with first die bonding materials 4a comprised of copper.

Conventionally, solder, which is low in material cost, has been used to bond a power semiconductor chip to a power circuit pattern, but in the present embodiment, in order to improve heat dissipation for the power semiconductor chips 5a to 5f, the first die bonding materials 4a comprised of copper are used.

The power semiconductor chips 5a to 5f are also referred to as a first RC-IGBT 5a to a sixth RC-IGBT 5f, respectively. In FIG. 1, the power semiconductor chips 5a to 5f are shown as the first RC-IGBT 5a to the sixth RC-IGBT 5f.

The power semiconductor chips 5a to 5f may be each configured with an IGBT chip and a diode which are a separate switching unit and reflux unit.

Further, the metal sheet 1, the insulating pattern 2, and the circuit patterns may be integrally configured as a plastic insulating substrate. In this case, as the circuit pattern of the plastic insulating substrate, it may be possible to employ a copper circuit pattern, which has an excellent contact thermal resistance with respect to the first die bonding materials 4a comprised of copper.

The control semiconductor chips 6a to 6d are semiconductor chips for controlling the power semiconductor chips 5a to 5f, and are mounted on the signal circuit patterns 3b. The control semiconductor chips 6a to 6d are bonded to the signal circuit patterns 3b with the second die bonding materials 4b. Solder is used as the second die bonding materials 4b. The control semiconductor chips 6a to 6d are also referred to as a first IC chip 6a to a fourth IC chip 6d, respectively.

Further, as the second die bonding materials 4b, it may be possible to use, instead of solder, a die bonding material comprised of copper, a silver die bonding material, or a non-conductive die bonding material such as a silicone adhesive.

The casing 15 is formed so as to surround the side surfaces of the metal sheet 1, the insulating pattern 2, the power circuit patterns 3a, the signal circuit patterns 3b, the power semiconductor chips 5a to 5f, and the control semiconductor chips 6a to 6d.

The P electrode 8, the U electrode 9, the V electrode 10, the W electrode 11, and the N electrode 12 are provided on the power side of the casing 15, and are connected to the power circuit patterns 3a with the aluminum wires 14. Further, the signal terminals 13 are provided on the signal side of the casing 15, and are connected to the signal circuit patterns 3b with the aluminum wires 14.

Figure 3:
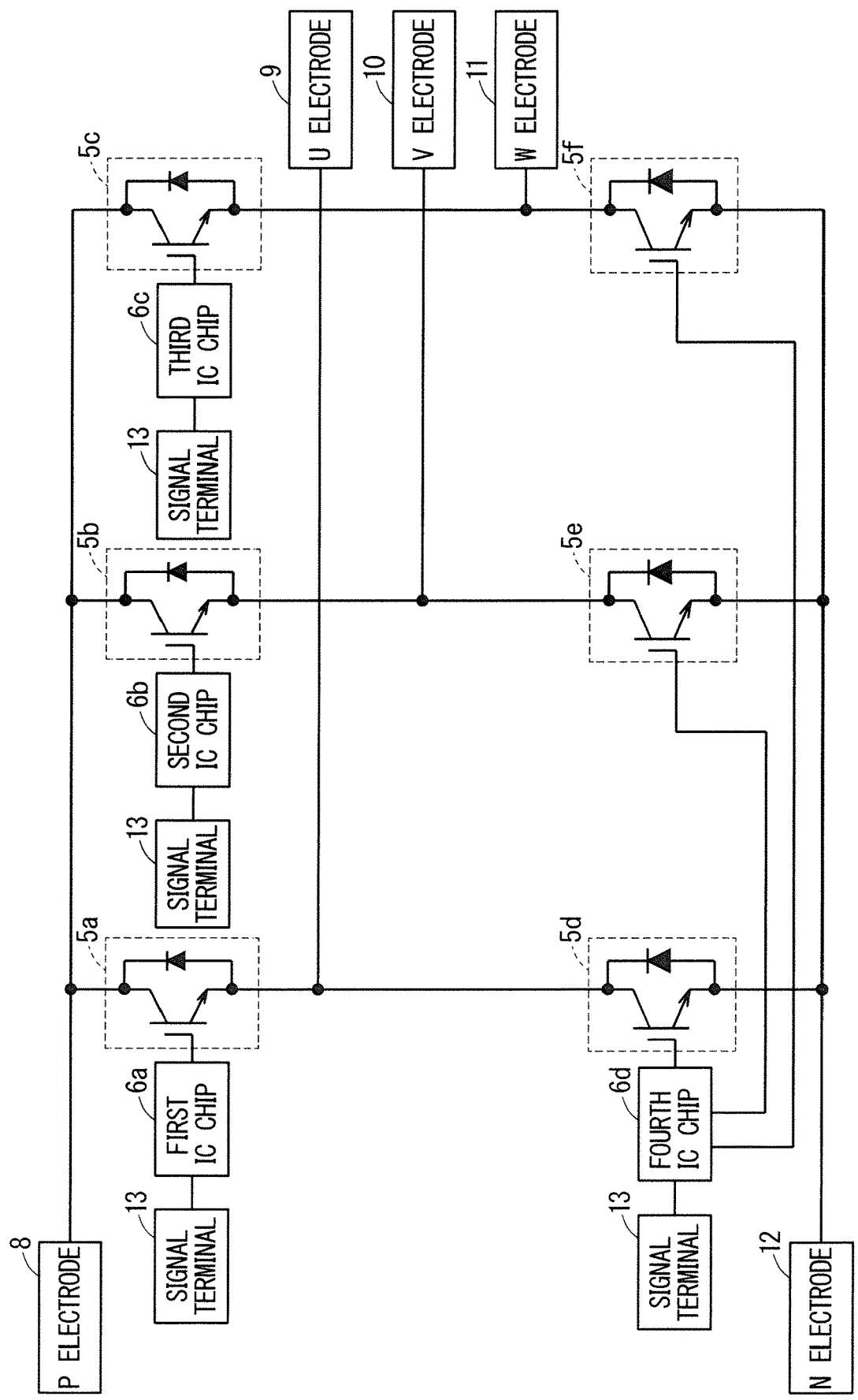
FIG. 3 is a circuit diagram of the semiconductor device according to the first preferred embodiment.

Next, a circuit configuration of the semiconductor device will be described with reference to FIG. 3 FIG. 3 is a circuit diagram of the semiconductor device according to the first preferred embodiment. In FIG. 3, the control semiconductor chips 6a to 6d are respectively shown as the first IC chips 6a to the fourth IC chips 6d.

As illustrated in FIG. 3, in order to drive the power semiconductor chips 5a to 5f, which have different output phases and different functions as upper arms or lower arms, the control semiconductor chips 6a to 6d are respectively provided so as to make pairs with the phases. However, because the control semiconductor chip 6d has a circuit configuration to drive the power semiconductor chips 5d to 5f, the control semiconductor chip 6d is integrated into one chip.

The control semiconductor chip 6d may be configured with three control semiconductor chips so as to individually drive the power semiconductor chips 5d to 5f.

<Method for Manufacturing Semiconductor Device>

Figure 4A:
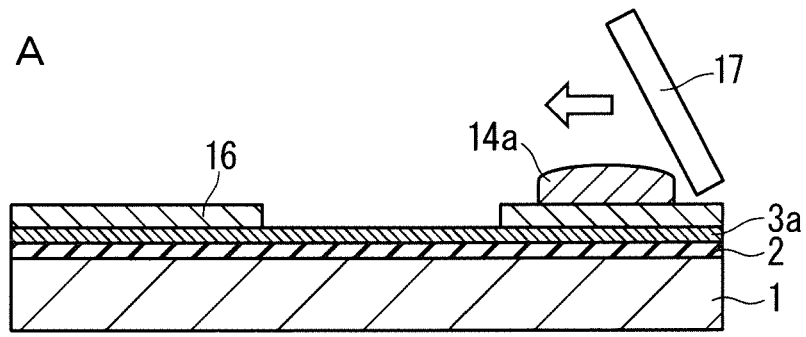
FIGS. 4A to 4C are cross-sectional views each illustrating a method for manufacturing the semiconductor device according to the first preferred embodiment.
Figure 4B:
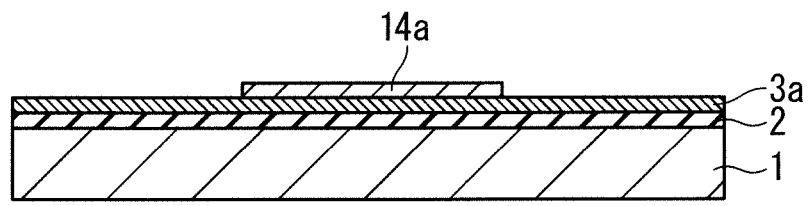
Figure 4C:
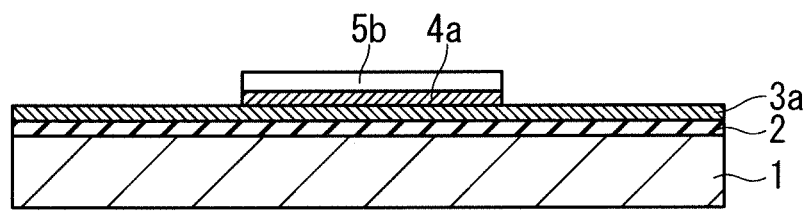

Next, a method for manufacturing a semiconductor device will be described with reference to FIGS. 4A to 4C. FIGS. 4A to 4C are cross-sectional views each illustrating the method for manufacturing the semiconductor device according to the first preferred embodiment. Note that, in FIGS. 4A to 4C, only the power semiconductor chip 5b is shown, and the power semiconductor chips 5a, 5c to 5f are not shown. Because these power semiconductor chips are bonded by the same method, the bonding of the semiconductor chips 5a, 5c to 5f are not described in the following description.

First, a metal sheet 1 having the power circuit pattern 3a and the signal circuit pattern 3b provided on the insulating pattern 2 is prepared. As illustrated in FIG. 4A, a mask 16 for screen printing is disposed on the power circuit pattern 3a. At this time, although not illustrated, the mask 16 is disposed also on the signal circuit pattern 3b. Then, a squeegee 17 is used to pour first paste material 14a into a portion, of the power circuit pattern 3a, exposed from the mask 16. Although not illustrated, the second paste material is poured into a portion, of the signal circuit pattern 3b, exposed from the mask 16.

Next, as illustrated in FIG. 4B, the mask 16 is removed to complete the application of the first paste material 14a and the application of the second paste material (not shown).

At this point in the method, the first paste material 14a is in a state of the first die bonding material 4a before curing, and the first paste material 14a is specifically a copper paste material. The second paste material is in a state of the second die bonding material 4b before curing, and the second past material is specifically a solder paste material.

Next, the power semiconductor chip 5b is mounted on the first paste material 14a. Although not illustrated, the control semiconductor chips 6a to 6d are mounted on the second paste materials. Then, a heat treatment is performed to cure the first paste material 14a, so that the first die bonding material 4a is formed as illustrated in FIG. 4C, whereby the power semiconductor chip 5b is bonded to the power circuit pattern 3a with the first die bonding material 4a. Although not illustrated, the above heat treatment cures the second paste materials to form the second die bonding materials 4b, and the control semiconductor chips 6a to 6d are bonded to the signal circuit patterns 3b with the second die bonding materials 4b.

In the above, the first paste material 14a and the second paste materials 14b are subjected to a heat treatment in the same step. However, since the first paste material 14a is a copper paste material and the second paste material 14b is a solder paste material, the curing temperature of the second paste material 14b is lower than the curing temperature of the first paste material 14a. Therefore, the first paste material 14a and the second paste material 14b may be subjected to a heat treatment in different steps.

FIGS. 5A to 5F are cross-sectional views each illustrating a method for manufacturing a semiconductor device according to a first variation of the first preferred embodiment. Note that, in FIGS. 5A to 5F, only the power semiconductor chip 5b and the control semiconductor chip 6b are shown, and the power semiconductor chips 5a, 5c to 5f and the control semiconductor chips 6a, 6c, 6d are not shown. However, because the power semiconductor chips 5a to 5f are bonded by the same method and the control semiconductor chips 6a to 6d are bonded by the same method, a description is not given on the bonding of the power semiconductor chips 5a, 5c to 5f or the control semiconductor chips 6a, 6c, 6d.

Figure 5A:
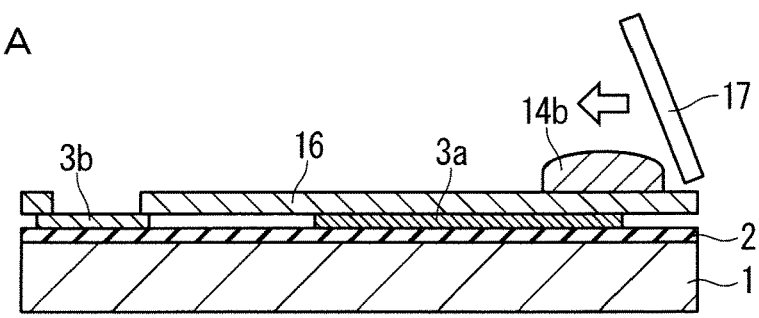
FIGS. 5A to 5F are cross-sectional views each illustrating a method for manufacturing a semiconductor device according to a first variation of the first preferred embodiment.

As illustrated in FIG. 5A, a mask 16 for screen printing is disposed on the circuit pattern. Then, a squeegee 17 is used to pour second paste material 14b into a portion, of the signal circuit pattern 3b, exposed from the mask 16.

Figure 5B:
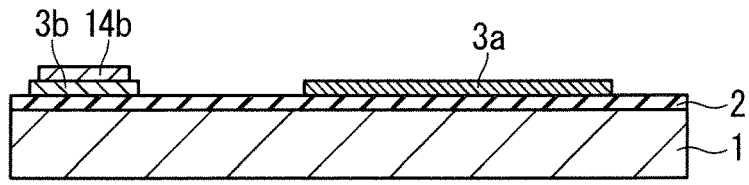

Next, as illustrated in FIG. 5B, the mask 16 is removed to complete the application of the second paste material 14b.

Figure 5C:
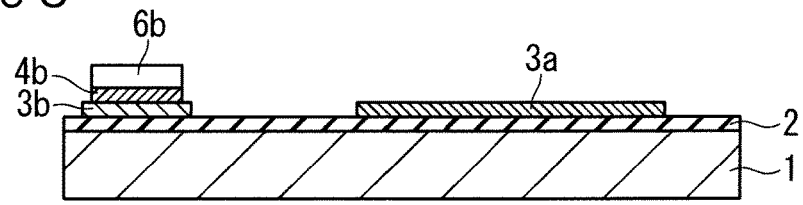

Next, the control semiconductor chip 6b is mounted on the second paste material 14b. Then, a heat treatment is performed at a temperature lower than the temperature for the first paste material 14a, and the second paste material 14b is cured to form the second die bonding material 4b as illustrated in FIG. 5C, so that the control semiconductor chip 6b is bonded to the signal circuit pattern 3b with the second die bonding material 4b.

Figure 5D:
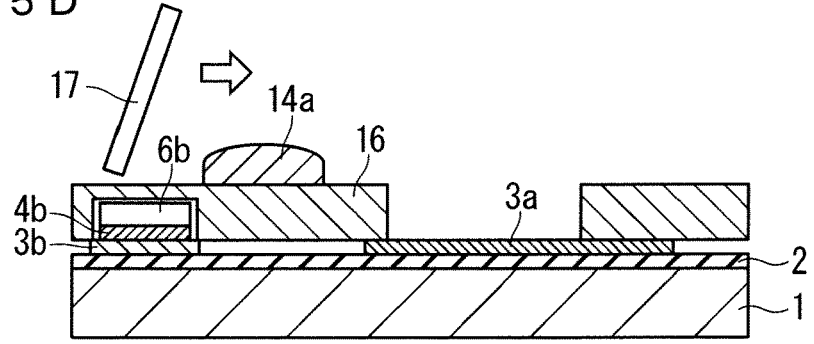

Next, as illustrated in FIG. 5D, a mask 16 for screen printing is disposed on the circuit pattern. At this time, the mask 16 is dispose so as to cover the control semiconductor chip 6b. Then, a squeegee 17 is used to pour first paste material 14a into a portion, of the power circuit pattern 3a, exposed from the mask 16.

Figure 5E:
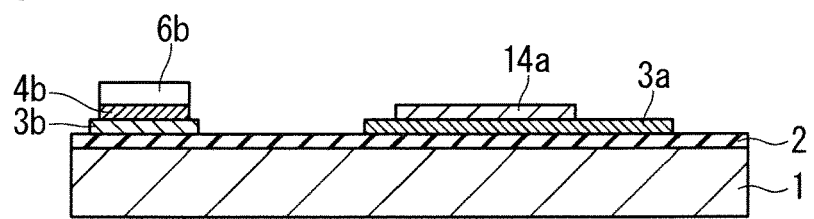

Next, as illustrated in FIG. 5E, the mask 16 is removed to complete the application of the first paste material 14a.

Figure 5F:
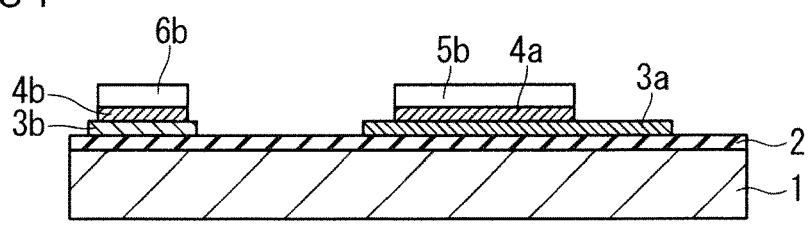

Next, the power semiconductor chip 5b is mounted on the first paste material 14a. Then, a heat treatment is performed at a temperature higher than the temperature for the second paste material 14b, and the first paste material 14a is cured to form the first die bonding material 4a as illustrated in FIG. 5F, so that the power semiconductor chip 5b is bonded to the power circuit pattern 3a with the first die bonding material 4a.

In the above two manufacturing methods, the first paste material 14a is applied to have a flat upper surface. However, when the power semiconductor chip 5b is mounted on the first paste material 14a, the power semiconductor chip 5b is pushed into the first paste material 14a, so that the first paste material 14a creeps up in some cases. To prevent or reduce the creep up, the first paste material 14a may be shaped. FIGS. 6A to 6E are cross-sectional views each illustrating a method for manufacturing a semiconductor device according to a second variation of the first preferred embodiment.

Note that, in FIGS. 6A to 6E, only the power semiconductor chip 5b is shown, and the power semiconductor chips 5a, 5c to 5f are not shown. Because these power semiconductor chips are bonded by the same method, the bonding of the semiconductor chips 5a, 5c to 5f are not described in the following description. Further, since the control semiconductor chips 6a to 6d are bonded by the same method as in the case of FIGS. 4A to 4C, and a description will not be given on the control semiconductor chips 6a to 6d.

Figure 6A:
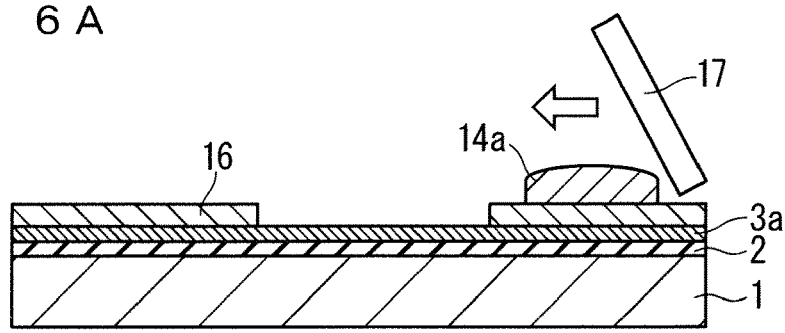
FIGS. 6A to 6E are cross-sectional views each illustrating a method for manufacturing a semiconductor device according to a second variation of the first preferred embodiment.

As illustrated in FIG. 6A, a mask 16 for screen printing is disposed on the power circuit pattern 3a. Then, a squeegee 17 is used to pour first paste material 14a into a portion, of the power circuit pattern 3a, exposed from the mask 16.

Figure 6B:
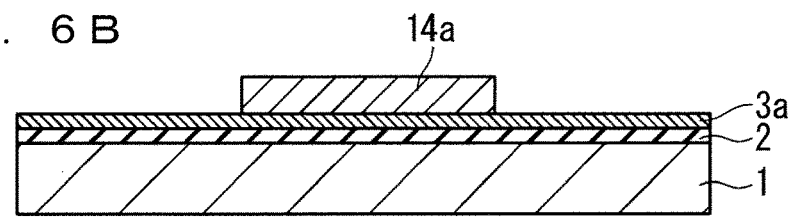

Next, as illustrated in FIG. 6B, the mask 16 is removed to complete the application of the first paste material 14a.

Figure 6C:
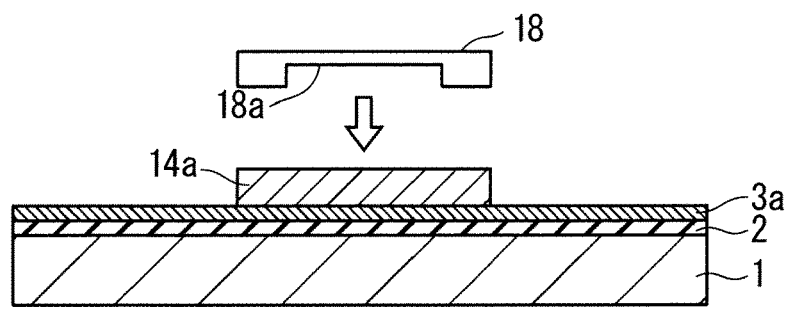
Figure 6D:
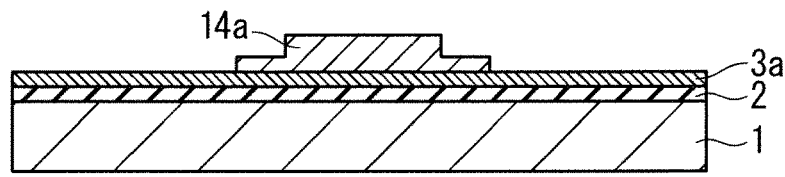

Next, as illustrated in FIG. 6C, a mask 18 for shaping is disposed on the first paste material 14a applied on the power circuit pattern 3a. A top view contour of the mask 18 is formed to have the same size as a top view contour of the first paste material 14a applied on the power circuit pattern 3a. In a part, of the lower surface of the mask 18, other than the outer peripheral part, in other words, an inner peripheral part of the lower surface of the mask 18, there is formed a recessed portion 18a that is recessed upward. The recessed portion 18a is disposed on the first paste material 14a, so that the first paste material 14a is shaped. When the mask 18 is removed, as illustrated in FIG. 6D, the part, of the first paste material 14a, other than the outer peripheral part, in other words, the inner peripheral part of the first paste material 14a is shaped to protrude upward.

Next, the power semiconductor chip 5b is mounted on the first paste material 14a. At this time, although not illustrated, the power semiconductor chip 5b is pushed onto the portion, of the first paste material 14a, protruding upward. Regarding the first paste material 14a, the outer peripheral part on the outer part of the upwardly protruding portion is recessed downward; therefore, the entire upper surface of the first paste material 14a becomes flat when the power semiconductor chip 5b is pushed in. As a result, the creeping up of the first paste material 14a can be prevented or reduced.

Figure 6E:
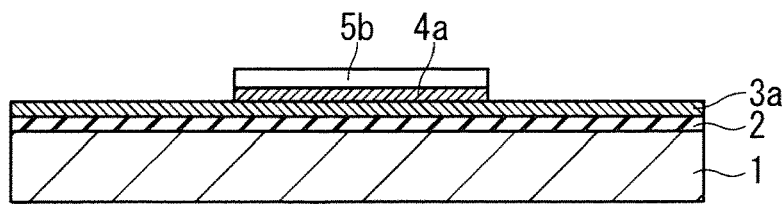

Next, a heat treatment is performed to cure the first paste material 14a, so that the first die bonding material 4a is formed as illustrated in FIG. 6E, whereby the power semiconductor chip 5b is bonded to the power circuit pattern 3a with the first die bonding material 4a.

The shaping of the first paste material 14a in the second variation of the first preferred embodiment may be employed in the first variation of the first preferred embodiment.

Advantageous Effects

As described above, the semiconductor device according to the first preferred embodiment includes: the metal sheet 1; the insulating pattern 2 provided on the metal sheet 1; the power circuit patterns 3a and the signal circuit patterns 3b that are provided on the insulating pattern 2; the power semiconductor chips 5a to 5f mounted on the power circuit patterns 3a; and the control semiconductor chips 6a to 6d that are mounted on the signal circuit patterns 3b and control the power semiconductor chips 5a to 5f. The power semiconductor chips 5a to 5f are bonded to the power circuit patterns 3a with first die bonding materials 4a comprised of copper, and the control semiconductor chips 6a to 6d are bonded to the signal circuit patterns 3b with second die bonding materials 4b.

As a result, since the first die bonding materials 4a comprised of copper are used to bond the power semiconductor chips 5a to 5f and the power circuit patterns 3a, heat dissipation for the power semiconductor chips 5a to 5f is improved as compared with a conventional case where solder is used. Therefore, the heat dissipation for the power semiconductor chips 5a to 5f can be ensured even when the power circuit patterns 3a are thinned. As a result, it is possible to secure the heat dissipation for the power semiconductor chips 5a to 5f and to achieve miniaturization of the semiconductor device.

The metal sheet 1, the insulating pattern 2, the power circuit patterns 3a, and the signal circuit patterns 3b are integrally configured.

In the case where the insulating pattern 2 is configured of ceramic, since the ceramic is a brittle material that is vulnerable to displacement, the insulating pattern 2 is divided into a plurality of parts, in some cases, in order to prevent or reduce influence due to deformation of the metal sheet 1 when the semiconductor device is driven. In the case of a plastic insulating substrate in which the metal sheet 1, the insulating pattern 2, the power circuit patterns 3a, and the signal circuit patterns 3b are integrally configured, it is possible to prevent or reduce the influence due to the deformation of the metal sheet 1 even if the insulating pattern is not divided into a plurality of parts. Therefore, a degree of freedom in layout design of the semiconductor device is improved, and it is possible to achieve further miniaturization of the semiconductor device.

Further, the method for manufacturing the semiconductor device according to the first preferred embodiment includes: a step (a) of applying the first paste materials 14a, which are in a state of the first die bonding materials 4a before curing, on the power circuit patterns 3a and applying the second paste materials 14b, which are in a state of the second die bonding materials 4b before curing, on the signal circuit patterns 3b; a step (b) of mounting the power semiconductor chips 5a to 5f on the first paste materials 14a and mounting the control semiconductor chips 6a to 6d on the second paste materials 14b; and a step (c) of curing the first paste materials 14a and the second paste materials 14b.

Therefore, by performing screen printing, it is possible to collectively apply the first paste materials 14a to the power semiconductor chips 5a to 5f of various phases, so that the productivity of the semiconductor device can be improved.

Further, the method for manufacturing the semiconductor device according to the first variation of the first preferred embodiment includes: a step (h) of applying the second paste materials 14b, which are in a state of the second die bonding materials 4b before curing, on the signal circuit patterns 3b, a step (i) of mounting the control semiconductor chips 6a to 6d on the second paste materials 14b, a step (j) of curing the second paste materials 14b; a step (k) of applying the first paste materials 14a, which are in a state of the first die bonding materials 4a before curing, on the power circuit patterns 3a; and a step (1) of mounting the power semiconductor chips 5a to 5f on the first paste materials 14a; and a step (m) of curing the first paste materials 14a. The curing temperature of the second paste materials 14b is lower than the curing temperature of the first paste materials 14a.

Therefore, a curing time of the second paste materials 14b can be shorter than a curing time of the first paste materials 14a, so that the productivity of the semiconductor device can be improved.

Further, the method for manufacturing the semiconductor device according to the second variation of the first preferred embodiment further includes, between the step (a) and the step (b) or between the step (k) and the step (1), a step (n) of shaping the first paste materials 14a such that the outer peripheral parts of the first paste materials 14a are recessed downward with respect to the inner peripheral parts of the first paste materials 14a.

When the power semiconductor chips 5a to 5f are mounted on the first paste materials 14a, the power semiconductor chips 5a to 5f are pushed onto the portions, of the first paste materials 14a, protruding upward. Regarding each first paste materials 14a, the outer peripheral part on the outer side of the upwardly protruding portion is recessed downward; therefore, the entire upper surface of the first paste material 14a becomes flat. As a result, the creeping up of the first paste materials 14a can be prevented or reduced.

Second Preferred Embodiment

<Structure of Semiconductor Device>

Figure 7:
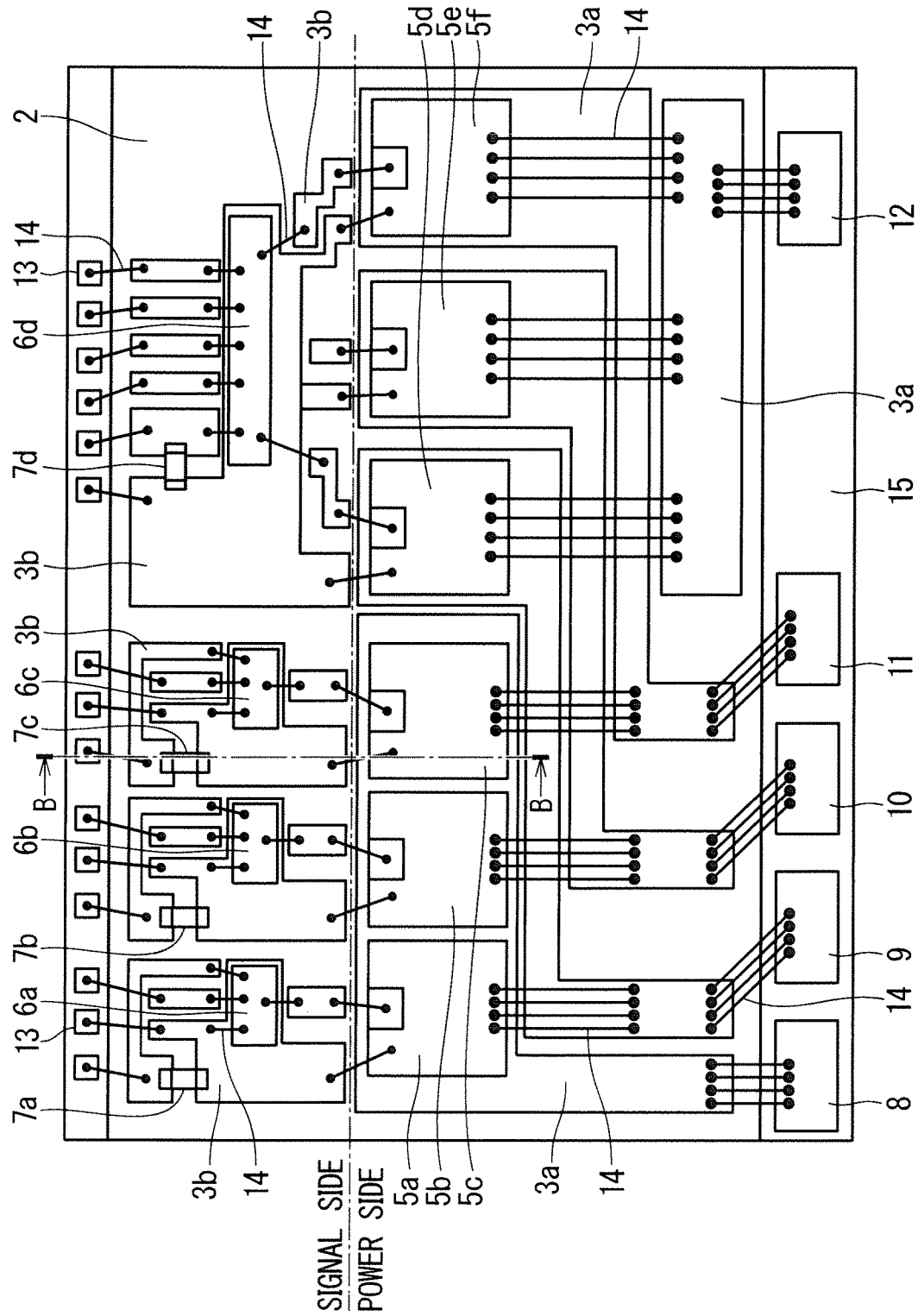
FIG. 7 is a top view illustrating a structure of a semiconductor device according to a second preferred embodiment.
Figure 8:
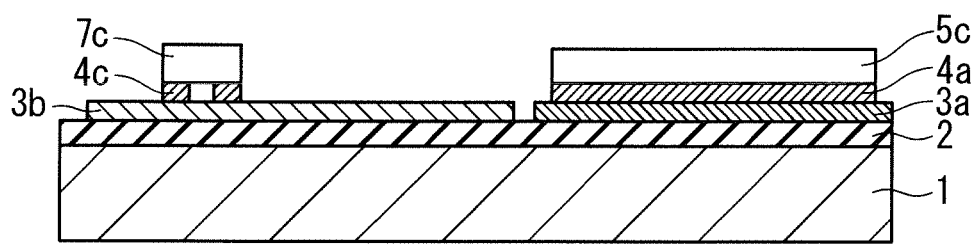
FIG. 8 is a cross-sectional view taken along line B-B of FIG. 7.

Next, a semiconductor device according to a second preferred embodiment will be described. FIG. 7 is a top view illustrating a structure of the semiconductor device according to the second preferred embodiment. FIG. 8 is a cross-sectional view taken along line B-B of FIG. 7. In the second preferred embodiment, the same components as those described in the first preferred embodiment are assigned the same reference signs, and the description thereof will be omitted.

As illustrated in FIGS. 7 and 8, in the second preferred embodiment, the semiconductor device further includes capacitive components 7a to 7d mounted on signal circuit patterns 3b. The capacitive components 7a to 7d are, for example, capacitors.

The capacitive components 7a to 7d are each bonded to two signal circuit patterns 3b with third die bonding materials 4c comprised of copper, and are respectively arranged so as to make pairs with control semiconductor chips 6a to 6d. Here, the thickness of the third die bonding materials 4c is the same as the thickness of the first die bonding materials 4a. Further, the capacitive components 7a to 7d are electrically connected to the power semiconductor chips 5a to 5f with aluminum wires 14.

By providing the capacitive components 7a to 7d, it is possible to supply stable voltages from the capacitive components 7a to 7d to the power semiconductor chips 5a to 5f when a voltage drop occurs when the semiconductor device is driven.

Figure 9:
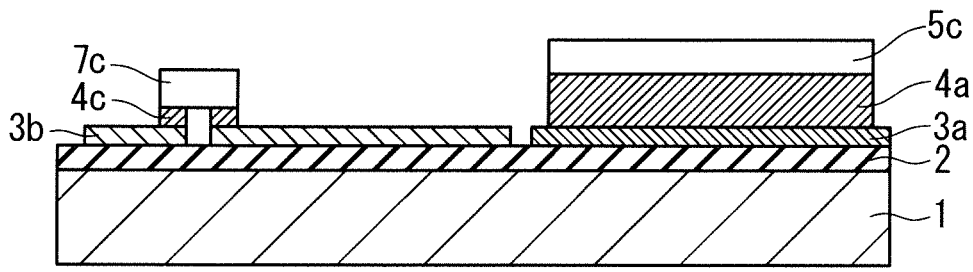
FIG. 9 is a diagram, of a variation of the second preferred embodiment, equivalent to FIG. 8.

It is also possible to make the thickness of the first die bonding materials 4a thicker than the thickness of the third die bonding materials 4c. FIG. 9 is a diagram, of a variation of the second preferred embodiment, equivalent to FIG. 8.

As illustrated in FIG. 9, by increasing the thickness of the first die bonding material 4a directly under the power semiconductor chip 5b, it is possible to further improve the heat dissipation of the semiconductor device.

<Method for Manufacturing Semiconductor Device>

Next, a method for manufacturing the semiconductor device will be described. As illustrated in FIG. 8, when the thickness of the third die bonding material 4c is the same as the thickness of the first die bonding material 4a, the same steps as for the power semiconductor chips 5a to 5f illustrated in FIGS. 4A to 4C are performed as follows: a third paste material, which is in a state of the third die bonding material 4c before curing, is applied; the capacitive components 7a to 7d are mounted; and then, the third paste material 14c is cured. Therefore, the case of FIG. 8 will not be described.

Hereinafter, with reference to FIGS. 10A to 10D, a description will be given on a method for manufacturing the semiconductor device according to a variation of the second preferred embodiment illustrated in FIG. 9. FIGS. 10A to 10D are cross-sectional views each illustrating the method for manufacturing the semiconductor device according to the variation of the second preferred embodiment.

Note that, in FIGS. 10A to 10D, only the power semiconductor chip Sb and the capacitive component 7b are shown, and the power semiconductor chips 5a, Sc to 5f and the capacitive components 7a, 7c, 7d are not shown. However, because the power semiconductor chips 5a to 5f are bonded by the same method and the capacitive components 7a to 7d are bonded by the same method, a description is not given on the bonding of the power semiconductor chips 5a, 5c to 5f or the bonding of the capacitive components 7a, 7c, 7d.

Figure 10A:
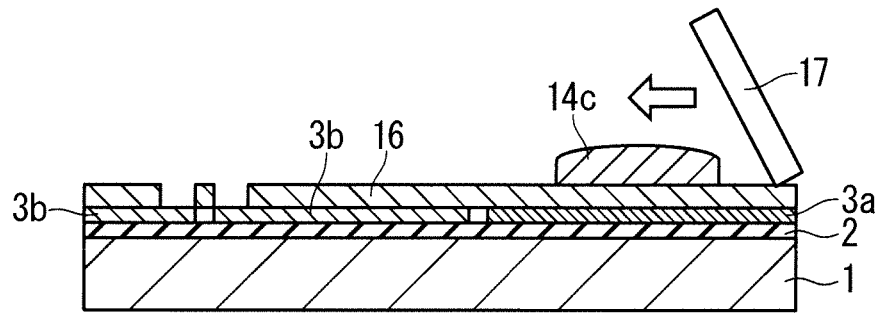
FIGS. 10A to 10D are cross-sectional views each illustrating a method for manufacturing a semiconductor device according to the variation of the second preferred embodiment.

As illustrated in FIG. 10A, a mask 16 for screen printing is disposed on the circuit pattern. Then, by using a squeegee 17, the third paste materials 14c are poured into portions of the signal circuit pattern 3b which are exposed from the mask 16 and on which the capacitive component 7b is mounted. Although not illustrated, the second paste materials are poured into portions of the signal circuit patterns 3b which are exposed from the mask 16 and on which the control semiconductor chips 6a to 6d are mounted. Then, the mask 16 is removed to complete the application of the third paste materials 14c and the application of the second paste materials (not shown).

Figure 10B:
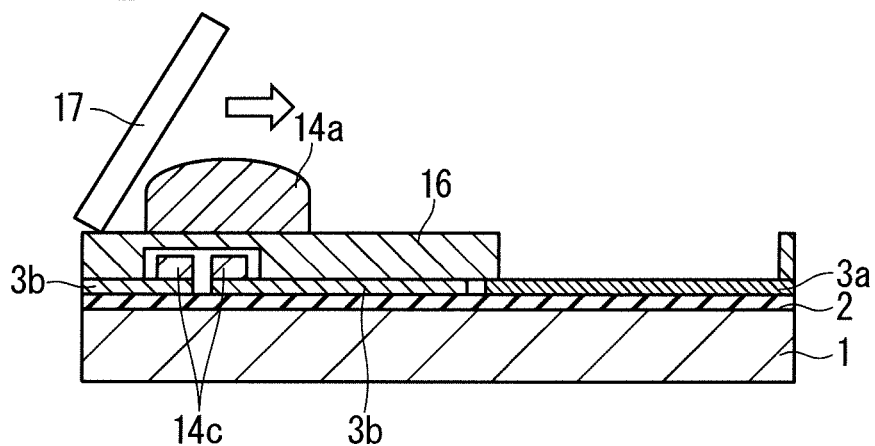

Next, as illustrated in FIG. 10B, a mask 16a for screen printing, which is thicker than the mask 16, is disposed on the circuit pattern. Then, a squeegee 17 is used to pour first paste material 14a into a portion, of the power circuit pattern 3a, exposed from the mask 16a. Then, the mask 16a is removed to complete the application of the first paste material 14a.

Figure 10C:
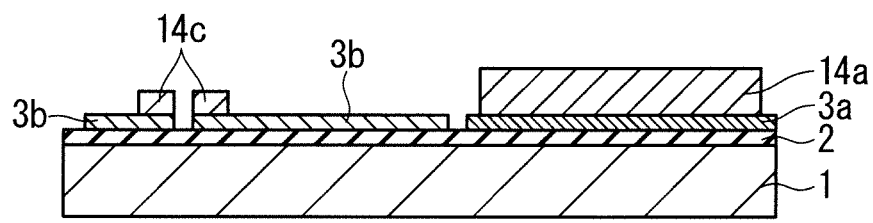

Next, as illustrated in FIG. 10C, the power semiconductor chip 5b is mounted on the first paste material 14a, and the capacitive component 7b is mounted on the third paste materials 14c. Although not illustrated, the control semiconductor chips 6a to 6d are mounted on the second paste materials.

Figure 10D:
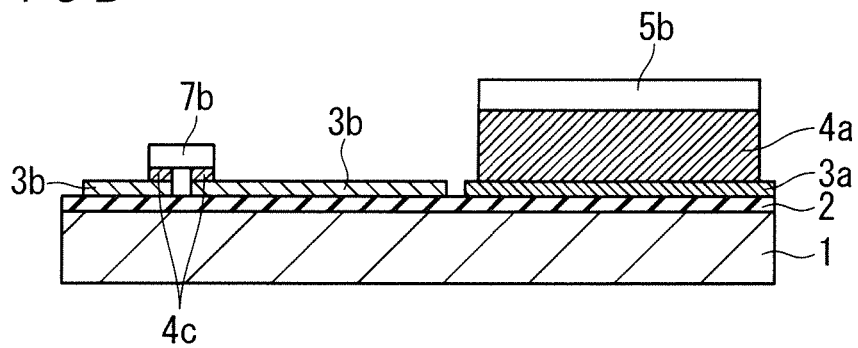

Then, a heat treatment is performed to cure the first paste material 14a and the third paste material 14c, so that the first die bonding material 4a and the third die bonding materials 4c are formed as illustrated in FIG. 10D. As a result, the power semiconductor chip 5b is bonded to the power circuit pattern 3a with the first die bonding material 4a, and the capacitive component 7b is bonded to the signal circuit patterns 3b with the third die bonding materials 4c. Although not illustrated, the above heat treatment cures the second paste materials to form the second die bonding materials 4b, and the control semiconductor chips 6a to 6d are bonded to the signal circuit patterns 3b with the second die bonding materials 4b.

Advantageous Effects

As described above, the semiconductor device according to the second preferred embodiment further includes the capacitive components 7a to 7d mounted on the signal circuit patterns 3b and electrically connected to the power semiconductor chips 5a to 5f. The capacitive components 7a to 7d are bonded to the signal circuit patterns 3b with the third die bonding materials 4c comprised of copper.

With this arrangement, it is possible to supply stable voltages from the capacitive components 7a to 7d to the power semiconductor chips 5a to 5f when a voltage drop occurs when the semiconductor device is driven. This makes it possible to improve reliability of the semiconductor device.

Further, since the thickness of the first die bonding materials 4a is thicker than the thickness of the third die bonding material 4c, it is possible to improve the heat dissipation of the semiconductor device. At this time, the signal circuit patterns 3b directly under the capacitive components 7a to 7d can be made fine, which contributes to miniaturization of the semiconductor device.

Further, the method for manufacturing the semiconductor device according to the variation of the second preferred embodiment includes: a step (d) of applying, on the signal circuit patterns 3b, the second paste materials 14b, which are in a state of the second die bonding materials 4b before curing and the third paste materials 14c, which are in a state of the third die bonding materials 4c before curing, such that both paste materials are thinner than the thickness of the first paste materials 14a, which are in a state of the first die bonding materials 4a before curing; a step (e) of applying the first paste materials 14a on the power circuit patterns 3a; a step (f) of mounting the power semiconductor chips 5a to 5f on the first paste materials 14a, mounting the control semiconductor chips 6a to 6d on the second paste materials 14b, and mounting the capacitive components 7a to 7d on the third paste materials 14c; and a step (g) of curing the first paste materials 14a, the second paste materials 14b, and the third paste materials 14c.

Therefore, by separately performing two screen printing steps, the paste materials having different thicknesses can be applied; therefore, it is possible to easily manufacture a semiconductor device having improved heat dissipation.

The shaping of the first paste materials 14a in the second variation of the first preferred embodiment may be employed in the second preferred embodiment and its variation. Specifically, the method further includes, between the step (e) and the step (f), a step (n) of shaping the first paste materials 14a such that the outer peripheral parts of the first paste materials 14a are recessed downward with respect to the inner peripheral parts of the first paste materials 14a. As a result, it is possible to prevent or reduce creeping up of the first paste materials 14a.

In addition, the preferred embodiments can be arbitrarily combined, and each preferred embodiment can be appropriately modified or omitted.

While the disclosure has been shown and described in detail, the foregoing description is in all aspects illustrative and not restrictive. It is therefore understood that numerous modifications and variations can be devised.

What is claimed is:
1. A semiconductor device comprising:
   a metal sheet;
   an insulating pattern provided on the metal sheet;
   a circuit pattern provided on the insulating pattern;
   a first power semiconductor chip mounted on the circuit pattern;
   a control semiconductor chip that is mounted on the circuit pattern and controls the first power semiconductor chip; and
   a second power semiconductor chip mounted on the circuit pattern,
   wherein the first power semiconductor chip is bonded to the circuit pattern with a first die bonding material comprised of copper,
   the control semiconductor chip is bonded to the circuit pattern with a second die bonding material,
   the second power semiconductor chip is bonded to the circuit pattern with the first die bonding material, and
   the first power semiconductor chip and the second power semiconductor chip are configured to have different phases.
2. The semiconductor device according to claim 1, further comprising a capacitive component mounted on the circuit pattern and electrically connected to the first power semiconductor chip,
   wherein the capacitive component is bonded to the circuit pattern with a third die bonding material comprised of copper.
3. The semiconductor device according to claim 1, wherein the metal sheet, the insulating pattern, and the circuit pattern are integrally configured.
4. The semiconductor device according to claim 2, wherein the first die bonding material has a thickness thicker than a thickness of the third die bonding material.
5. A method for manufacturing a semiconductor device that is for manufacturing the semiconductor device according to claim 1, the method comprising:
   (a) applying, on the circuit pattern, a first paste material, which is in a state of the first die bonding material before curing, and a second paste material, which is in a state of the second die bonding material before curing;

(b) mounting the first power semiconductor chip on the first paste material and the control semiconductor chip on the second paste material; and (c) curing the first paste material and the second paste material.

6. A method for manufacturing a semiconductor device that is for manufacturing the semiconductor device according to claim 2, the method comprising:

(d) applying, on the circuit pattern, a second paste material, which is in a state of the second die bonding material before curing and a third paste material, which is in a state of the third die bonding material before curing, wherein the second paste material and the third paste material are applied thinner than a thickness of a first paste material, which is in a state of the first die bonding material before curing;

(e) applying the first paste material on the circuit pattern;

(f) mounting the first power semiconductor chip on the first paste material, the control semiconductor chip on the second paste material, and the capacitive component on the third paste material; and (g) curing the first paste material, the second paste material, and the third paste material.

7. A method for manufacturing a semiconductor device that is for manufacturing the semiconductor device according to claim 1, the method comprising:

(h) applying, on the circuit pattern, a second paste material, which is in a state of the second die bonding material before curing;

(i) mounting the control semiconductor chip on the second paste material;

(j) curing the second paste material;

(k) applying, on the circuit pattern, a first paste material, which is in a state of the first die bonding material before curing;

(l) mounting the first power semiconductor chip on the first paste material; and (m) curing the first paste material, wherein a curing temperature of the second paste material is lower than a curing temperature of the first paste material.

8. The method for manufacturing a semiconductor device according to claim 5, further comprising, between the step (a) and the step (b), (n) shaping the first paste material such that an outer peripheral part of the first paste material is recessed downward with respect to an inner peripheral part of the first paste material.

9. The method for manufacturing a semiconductor device according to claim 6, further comprising, between the step (e) and the step (f), (n) shaping the first paste material such that an outer peripheral part of the first paste material is recessed downward with respect to an inner peripheral part of the first paste material.

10. The method for manufacturing a semiconductor device according to claim 7, further comprising, between the step (k) and the step (l), (n) shaping the first paste material such that an outer peripheral part of the first paste material is recessed downward with respect to an inner peripheral part of the first paste material.

11. The semiconductor device according to claim 1, wherein the control semiconductor chip is configured to control both of the first power semiconductor chip and the second power semiconductor chip.

12. The semiconductor device according to claim 1, further comprising an other control semiconductor chip bonded to the circuit pattern with the second die bonding material,
wherein the other control semiconductor chip is configured to control the second power semiconductor chip.

13. The semiconductor device according to claim 1, further comprising a third power semiconductor chip bonded to the circuit pattern with the first die bonding material,
wherein the first power semiconductor chip is connected in series with the third power semiconductor chip to form an upper arm and a lower arm.

14. The semiconductor device according to claim 13, further comprising an other control semiconductor chip bonded to the circuit pattern with the second die bonding material,
wherein the other control semiconductor chip is configured to control the third power semiconductor chip.

15. The semiconductor device according to claim 1, wherein the first die bonding material is directly bonded to the first power semiconductor chip and the circuit pattern.

16. The semiconductor device according to claim 1, wherein the second die bonding material is directly bonded to the control semiconductor chip and the circuit pattern.

17. The semiconductor device according to claim 1, wherein the first die bonding material and the second die bonding material are different materials.

* * * * *